(12) United States Patent
Hsu et al.

(10) Patent No.: US 10,405,418 B2
(45) Date of Patent: Sep. 3, 2019

(54) DIFFERENTIAL SIGNAL TRANSMITTING CIRCUIT BOARD

(71) Applicant: INDUSTRIAL TECHNOLOGY RESEARCH INSTITUTE, Hsinchu (TW)

(72) Inventors: Chien-Min Hsu, Hsinchu County (TW); Shih-Hsien Wu, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/387,604

(22) Filed: Dec. 21, 2016

(65) Prior Publication Data

US 2018/0177044 A1 Jun. 21, 2018

(51) Int. Cl.
| H03H 7/38 | (2006.01) |
| H05K 1/02 | (2006.01) |
| H01P 3/02 | (2006.01) |
| H01P 1/22 | (2006.01) |

(52) U.S. Cl.
CPC ........... *H05K 1/0245* (2013.01); *H01P 3/026* (2013.01); *H03H 7/38* (2013.01); *H05K 1/0251* (2013.01); *H01P 1/227* (2013.01); *H05K 1/024* (2013.01); *H05K 2201/0187* (2013.01)

(58) Field of Classification Search
CPC .... H05K 1/0245; H05K 1/024; H05K 1/0242; H03H 7/38
USPC ............................... 333/1, 4, 5, 236, 246, 33
See application file for complete search history.

(56) References Cited

U.S. PATENT DOCUMENTS

| 7,129,567 B2 | 10/2006 | Kirby et al. |
| 7,282,784 B2 | 10/2007 | Kirby et al. |
| 7,355,267 B2 | 4/2008 | Kirby et al. |
| 7,361,842 B2 | 4/2008 | Brist et al. |
| 7,400,214 B2 | 7/2008 | Storniolo et al. |
| 7,495,316 B2 | 2/2009 | Kirby et al. |
| 7,767,913 B2 | 8/2010 | Corisis et al. |
| 7,781,889 B2 | 8/2010 | Leader et al. |
| 7,897,880 B1 | 3/2011 | Goergen et al. |

(Continued)

FOREIGN PATENT DOCUMENTS

| CN | 1355665 A | 6/2002 |
| CN | 103270818 A | 8/2013 |

(Continued)

OTHER PUBLICATIONS

TW Office Action dated Jun. 27, 2017 as received in Application No. 105142570.

(Continued)

*Primary Examiner* — Stephen E. Jones
(74) *Attorney, Agent, or Firm* — Maschoff Brennan

(57) ABSTRACT

A differential signal transmitting circuit board includes a substrate, at least two differential conductive elements, and at least one insulating element. The differential conductive elements are disposed in the substrate. The insulating element is disposed in the substrate. The insulating element is close to or contacted to the differential conductive elements. A material of the substrate has a first equivalent dielectric constant. A material of the insulating element has a second equivalent dielectric constant. The first equivalent dielectric constant is different from the second equivalent dielectric constant.

17 Claims, 16 Drawing Sheets

(56) References Cited

U.S. PATENT DOCUMENTS

| | | | |
|---|---|---|---|
| 7,994,895 B2 | 8/2011 | Coolbaugh et al. | |
| 8,107,254 B2 | 1/2012 | Bandholz et al. | |
| 8,230,586 B2 | 7/2012 | Coolbaugh et al. | |
| 8,426,743 B2 | 4/2013 | Corisis et al. | |
| 8,432,027 B2 | 4/2013 | Foster, Sr. et al. | |
| 8,546,243 B2 | 10/2013 | Kemerer et al. | |
| 8,653,625 B2 | 2/2014 | Hui et al. | |
| 8,658,911 B2 | 2/2014 | Cases et al. | |
| 8,741,729 B2 | 6/2014 | Kemerer et al. | |
| 8,766,107 B2 | 7/2014 | Cases et al. | |
| 8,780,578 B2 | 7/2014 | Foster, Sr. et al. | |
| 8,823,162 B2 | 9/2014 | Foster, Sr. et al. | |
| 8,853,848 B2 | 10/2014 | Wu | |
| 8,881,379 B2 | 11/2014 | Coolbaugh et al. | |
| 9,125,304 B2 | 9/2015 | Wu et al. | |
| 9,258,883 B2 | 2/2016 | Wu et al. | |
| 9,363,890 B2 | 6/2016 | Ohmori et al. | |
| 9,807,867 B2* | 10/2017 | Wu | H01L 21/485 |
| 2002/0179332 A1* | 12/2002 | Uematsu | H05K 1/115 174/262 |
| 2006/0082984 A1 | 4/2006 | Wu | |
| 2006/0118329 A1 | 6/2006 | Nakamura | |
| 2007/0273026 A1 | 11/2007 | Tien et al. | |
| 2013/0025119 A1 | 1/2013 | Cases et al. | |
| 2013/0111745 A1* | 5/2013 | Ao | H05K 1/0251 29/837 |
| 2016/0174360 A1 | 6/2016 | Hsu et al. | |

FOREIGN PATENT DOCUMENTS

| | | |
|---|---|---|
| CN | 104170532 A | 11/2014 |
| TW | I237381 B | 8/2005 |
| TW | I242783 B | 11/2005 |
| TW | I456726 B | 10/2014 |
| TW | I484876 B | 5/2015 |
| TW | 201526727 A | 7/2015 |
| TW | 201601269 A | 1/2016 |
| TW | 201622508 A | 6/2016 |
| TW | 201633859 A | 9/2016 |
| TW | 201705826 A | 2/2017 |

OTHER PUBLICATIONS

Khalid and Mahyuddin "Improvement on Return-Path-Discontinuity Issue through RLC Termination for Plating-Via-Stub", 2015 IEEE International Circuits and Systems Symposium (ICSyS), Sep. 2015, pp. 27-32.

Lo and Cheah, "Package Technology Evaluation and Optimization for High-Speed Applications", 2014 IEEE International Symposium on Electromagnetic Compatibility (EMC), Aug. 2014, pp. 625-630.

Zhang et al., "PCB Via to Trace Return Loss Optimization for >25Gbps Serial Links", 2014 IEEE International Symposium on Electromagnetic Compatibility (EMC), Aug. 2014, pp. 619-624.

* cited by examiner

DIFFERENTIAL SIGNAL TRANSMITTING CIRCUIT BOARD

TECHNICAL FIELD

The invention relates to a signal transmitting circuit board, more particularly to a differential signal transmitting circuit board for differential signal transmission.

BACKGROUND

In the design of circuit, the transmission of electrical signal can be achieved through a single line. However, the transmission of electrical signal will be affected by an external electric field or magnetic field, and such influence will result in signal distortion. Therefore, a duo electrically conductive line for transmitting differential signal is invented. When the differential signal is transmitted from one circuit layer to another circuit layer, the electrically conductive component is usually used to electrically connect these two circuit layers.

However, in a circuit board, a base layer (a substrate of the circuit board) has a limited area for the distribution of the circuits, so the size for the electrically conductive component is restricted. As a result, an equivalent impedance of the electrically conductive component will not match an equivalent impedance of the electrically conductive lines, which results in signal reflection while the differential signal is passing through the electrically conductive component from the circuit layer or passing through the circuit layer from the electrically conductive component, and further results in signal distortion. Especially, when the differential signal is in high frequency, the signal distortion is more severe. In order to meet the requirement of increasing amount of signal transmission, the signal reflection is an important problem to be solved in this field.

SUMMARY

The present invention provides a differential signal transmitting circuit board in order to make an equivalent impedance of electrically conductive components to match a specific value so as to reduce signal distortion.

One embodiment of the invention provides a differential signal transmitting circuit board including a base layer, at least two electrically conductive components and at least one insulating component. The electrically conductive components are disposed in the base layer. The insulating component is disposed in the base layer. The insulating component is located close to or in contact with the at least two electrically conductive components. The base layer has a first equivalent dielectric constant. The insulating component has a second equivalent dielectric constant. The first equivalent dielectric constant is different from the second equivalent dielectric constant.

According to the differential signal transmitting circuit board as discussed above, due to the configuration of the insulating component being located close to or in contact with the electrically conductive components, an equivalent impedance of the electrically conductive components is able to be properly adjusted in order to match a specific value. Therefore, the signal reflection in the electrically conductive components is reduced so as to reduce signal distortion of the differential signal, so that the circuit board is able to transmit high-frequency differential signal.

The aforementioned contents and the following embodiments are exemplary of the spirits and principles of the invention, and are used to provide further explanations of the claims.

DETAILED DESCRIPTION

Features and advantages of embodiments of the invention are described in the following detailed description, it allows the person skilled in the art to understand the technical contents of the embodiments of the invention and implement them, and the person skilled in the art can easily comprehend the purposes of the advantages of the invention. The following embodiments are further illustrating the perspective of the invention, but not intending to limit the invention.

The drawings may not be drawn to actual size or scale, some exaggerations may be necessary in order to emphasize basic structural relationships, while some are simplified for clarity of understanding, and the present invention is not limited thereto. It is allowed to have various adjustments under the spirit of the present invention. In the specification, the term "substantially" is referred to the complete or nearly complete extent or degree of a structure, which means that it is allowable to have tolerance during manufacturing.

Figure 1:
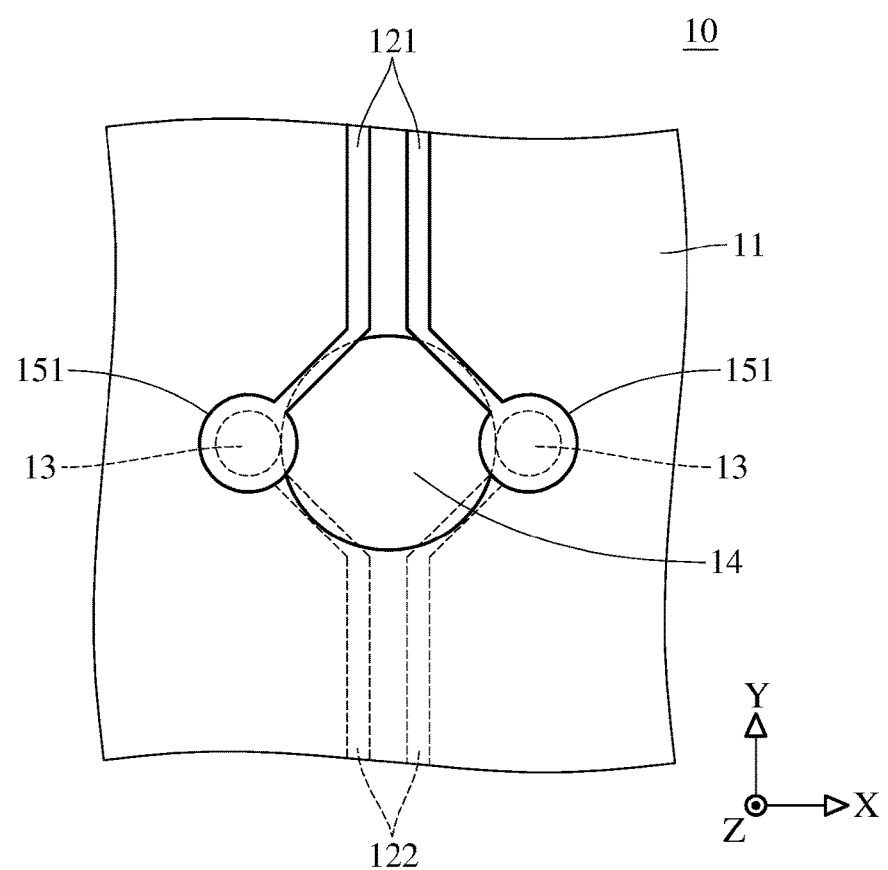
FIG. 1 is a top view of a differential signal transmitting circuit board according to one embodiment of the invention.
Figure 2:
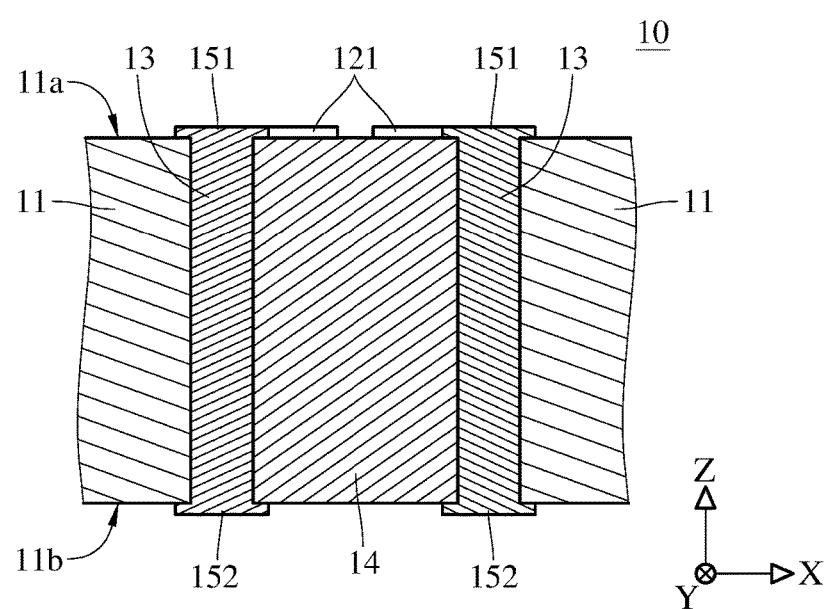
FIG. 2 is a cross-sectional view of the differential signal transmitting circuit board in FIG. 1.

Please refer to FIGS. 1 to 2. FIG. 1 is a top view of a differential signal transmitting circuit board according to one embodiment of the invention, and FIG. 2 is a cross-sectional view of the differential signal transmitting circuit board in FIG. 1. In this embodiment, a differential signal transmitting circuit board 10 is provided. The differential signal transmitting circuit board 10 includes a base layer 11, two first electrically conductive lines 121, two second electrically conductive lines 122, two electrically conductive components 13, a insulating component 14, two first electrically conductive pads 151 and two second electrically conductive pads 152.

The base layer 11 has a first equivalent dielectric constant. In this embodiment, the base layer 11 is a single layer, but the present invention is not limited thereto. In some embodiments, the base layer may be a composite layer; in such a case, the first equivalent dielectric constant is determined according to the dielectric constants of the layers in the composite layer.

The two first electrically conductive lines 121 are disposed on a first surface 11a of the base layer 11, and extend along a direction parallel to the base layer 11. The two second electrically conductive lines 122 are disposed on a second surface 11b of the base layer 11, and extend along a horizontal direction of the base layer 11. The phrase "horizontal direction of the base layer 11" used herein means a direction substantially parallel to the X-Y plane in figures. The first electrically conductive lines 121 and the second electrically conductive lines 122 are configured for differential signal transmission.

The two electrically conductive components 13 are disposed in the base layer 11, and extend along a vertical direction of the base layer 11. The phrase "vertical direction of the base layer 11" used herein means a direction substantially parallel to the Z-axis in figures. The two first electrically conductive pads 151 are respectively electrically connected to top ends of the two electrically conductive components 13. The two first electrically conductive lines 121 are respectively electrically connected to the two first electrically conductive pads 151. The two second electrically conductive pads 152 are respectively electrically connected to two bottom ends of the two electrically conductive components 13. The two second electrically conductive lines 122 are respectively electrically connected to the two second electrically conductive pads 152. An outer diameter of each first electrically conductive pad 151 and an outer diameter of each second electrically conductive pad 152 are both greater than an outer diameter of each electrically conductive component 13. In this embodiment, each electrically conductive component 13 is a columnar, solid and electrically conductive object, but the present invention is not limited thereto. In some embodiments, each electrically conductive component may be a columnar, hollow and electrically conductive object, or a columnar, hollow and electrically conductive object filled with a filling material, such as a gel, an isolation material or an electrically conductive material.

The insulating component 14 is disposed in the base layer 11, and is located between the two electrically conductive components 13. In other words, the insulating component 14 is located at an inner side of the electrically conductive component 13. The insulating component 14 has a second equivalent dielectric constant. The second equivalent dielectric constant is different from the first equivalent dielectric constant of the base layer 11. In this embodiment, the second equivalent dielectric constant ranges in 1 to 50, and the insulating component 14 is composed of single type of dielectric material, but the present invention is not limited thereto. In some embodiments, the dielectric component may be composed of multiple types of dielectric materials. The insulating component 14 is in contact with the two electrically conductive components 13. In this embodiment, the insulating component 14 is solid, but the present invention is not limited thereto. In some embodiments, the insulating component is not solid; for example, the insulating component may be a fluid, such as a liquid or gas, that is capable of flowing and that changes its shape at a steady rate when acted upon by a force tending to change its shape.

Figure 3:
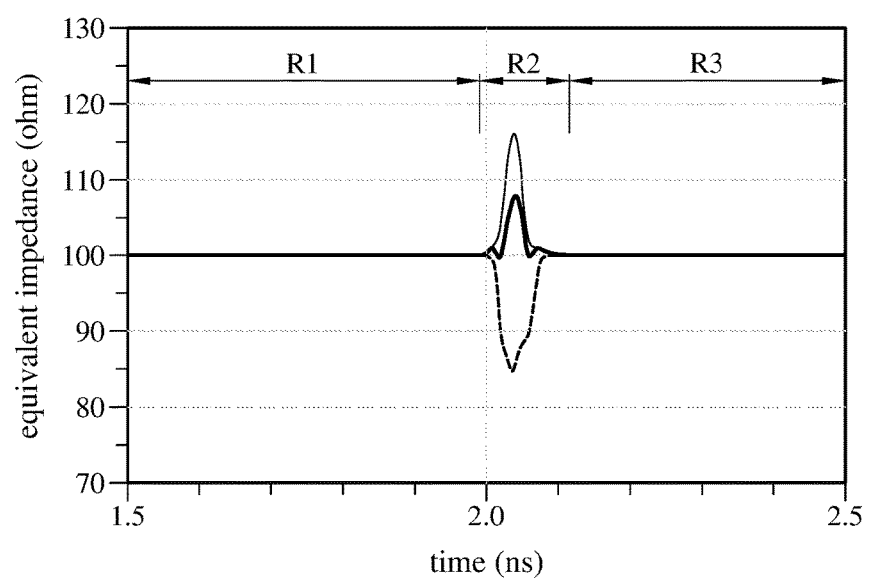
FIG. 3 is a chart showing equivalent impedance of the differential signal transmitting circuit board in FIG. 1.

Please refer to FIG. 3 FIG. 3 is a chart showing equivalent impedance of the differential signal transmitting circuit board in FIG. 1. FIG. 3 shows a simulation of the magnitude of the equivalent impedance when a differential signal is input at one end of the first electrically conductive line 121 of the differential signal transmitting circuit board 10. As shown in FIG. 3, a range R1 represents a time period during the differential signal passing through the first electrically conductive line 121, a range R2 represents a time period during the differential signal passing through the electrically conductive component 13, and a range R3 represents a time period during the differential signal passing through the second electrically conductive line 122.

As shown in FIG. 3, the first equivalent dielectric constant of the base layer 11 is 3.4. The thin solid line shows a simulation while the second equivalent dielectric constant of the insulating component 14 is 1, the thick solid line shows a simulation while the second equivalent dielectric constant of the insulating component 14 is 3.4, and the dotted line shows a simulation while the second equivalent dielectric constant of the insulating component 14 is 15. By comparing these lines, it is noted that the magnitude of the equivalent impedance of the electrically conductive component 13 is greater when the second equivalent dielectric constant of the insulating component 14 is less than the first equivalent dielectric constant of the base layer 11, otherwise, the magnitude of the equivalent impedance of the electrically conductive component 13 is lesser when the second equivalent dielectric constant of the insulating component 14 is larger than the first equivalent dielectric constant of the base layer 11.

Generally, in an embodiment of no insulating component disposed between the electrically conductive components, the equivalent impedance of the electrically conductive components is higher with the increase of the distance between the electrically conductive components. In other words, the equivalent impedance of the electrically conductive components is lower with the decrease of the distance between the electrically conductive components. Therefore, as shown in FIGS. 1 and 2, if the equivalent impedance of the electrically conductive components is too high while there is no insulating component, the insulating component 14 having a relatively large equivalent dielectric constant will be provided in order to reduce the equivalent impedance of the electrically conductive components 13. On the contrary, if the equivalent impedance of the electrically conductive components is too low while there is no insulating component, the insulating component 14 having a relatively small equivalent dielectric constant will be provided in order to increase the equivalent impedance of the electrically conductive components 13. As a result, the equivalent impedance of the electrically conductive components 13 is able to match the equivalent impedance of the first electrically conductive lines 121 and the second electrically conductive lines 122. In FIG. 3, when the second equivalent dielectric constant of the insulating component 14 ranges in 6 to 7, the equivalent impedance of the electrically conductive components 13 is about 100 Ohm.

Figure 4:
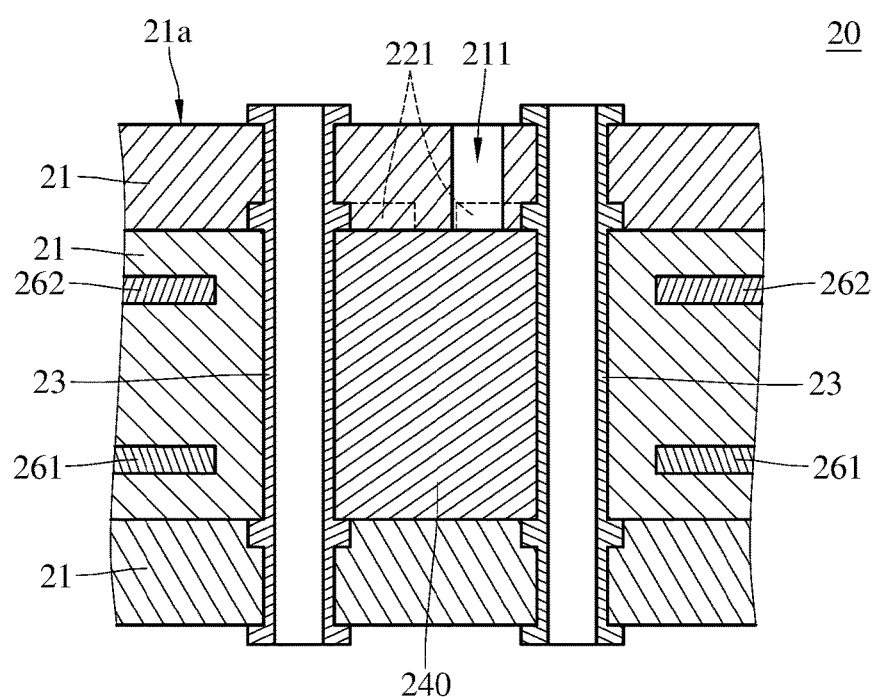
FIG. 4 is a cross-sectional view of a semi-finished differential signal transmitting circuit board according to another embodiment of the invention.
Figure 5:
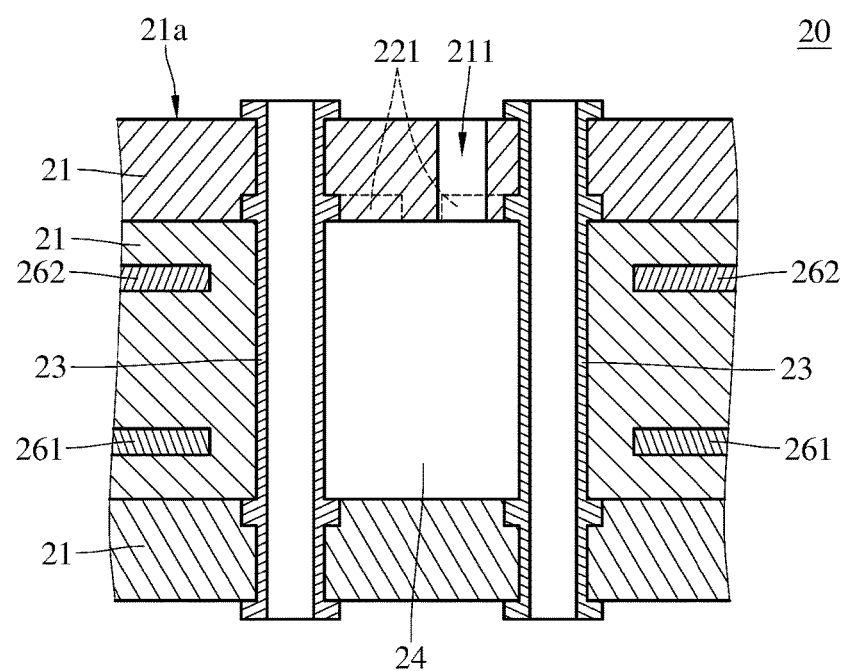
FIG. 5 is a cross-sectional view of the differential signal transmitting circuit board in FIG. 4.

Please refer to FIG. 4 to FIG. 5. FIG. 4 is a cross-sectional view of a semi-finished differential signal transmitting circuit board according to another embodiment of the invention, and FIG. 5 is a cross-sectional view of the differential signal transmitting circuit board in FIG. 4. In this embodiment, a differential signal transmitting circuit board 20 is provided. The differential signal transmitting circuit board 20 is similar to the differential signal transmitting circuit board 10 in FIG. 1 and FIG. 2, so the differences between these embodiments are described. The differential signal transmitting circuit board 20 further includes a first electrically conductive layer 261 and a second electrically conductive layer 262. The first electrically conductive layer 261 and the second electrically conductive layer 262 are disposed in the base layer 21. The first electrically conductive layer 261 is substantially parallel to the first electrically conductive lines 221, and the second electrically conductive layer 262 is substantially parallel to the first electrically conductive layer 261. The two first electrically conductive lines 221 are disposed in the base layer 21. The electrically conductive components 23 penetrate through the first electrically conductive layer 261 and the second electrically conductive layer 262. The electrically conductive components 23 and the first electrically conductive layer 261 are electrically isolated from each other through the base layer 21. The electrically conductive components 23 and the second electrically conductive layer 262 are electrically isolated from each other through the base layer 21. One of the first electrically conductive layer 261 and the second electrically conductive layer 262 is connected to ground, and the other one of the first electrically conductive layer 261 and the second electrically conductive layer 262 is electrically connected to a power source. Or, both the first electrically conductive layer 261 and the second electrically conductive layer 262 are connected to ground. In some embodiments, the differential signal transmitting circuit board may have no second electrically conductive layer 262 but have a first electrically conductive layer 261 being disposed at the center of the base layer 21.

In addition, in this embodiment, each electrically conductive component 23 of the differential signal transmitting circuit board 20 is a columnar, hollow and electrically conductive object, but the present invention is not limited thereto. In some embodiments, each electrically conductive component may be a columnar, hollow and electrically conductive object filled with a filling material, such as a gel, an isolation material of an electrically conductive material. Or, the electrically conductive component may be a columnar, solid and electrically conductive object.

In this embodiment, the base layer 21 of the differential signal transmitting circuit board 20 is a composite layer composed of several layers made of different materials, and the materials of the layers are determined according to actual requirements. As shown in FIG. 4, a volatile material 240 is disposed in a place for the disposal of an insulating component 24 as shown in FIG. 5. The volatile material 240 penetrates through the first electrically conductive layer 261 and the second electrically conductive layer 262. The base layer 21 has at least one hole 211. The hole 211 extends from the first surface 21a of the base layer 21 to the volatile material 240, and is connected to the volatile material 240. The differential signal transmitting circuit board 20 can be heated up to about 250° C. to 280° C., so that the volatile material 240 volatiles from the differential signal transmitting circuit board 20 through the hole 211, and then the space previously occupied by the volatile material 240 is filled up by other materials. That is, as shown in FIG. 5, the insulating component 24 is filled in the differential signal transmitting circuit board 20, and the insulating component 24 is made of fluid material, such as air. If the differential signal transmitting circuit board 20 is in a vacuum environment, the second equivalent dielectric constant of the insulating component 24 will be 1.

Figure 6:
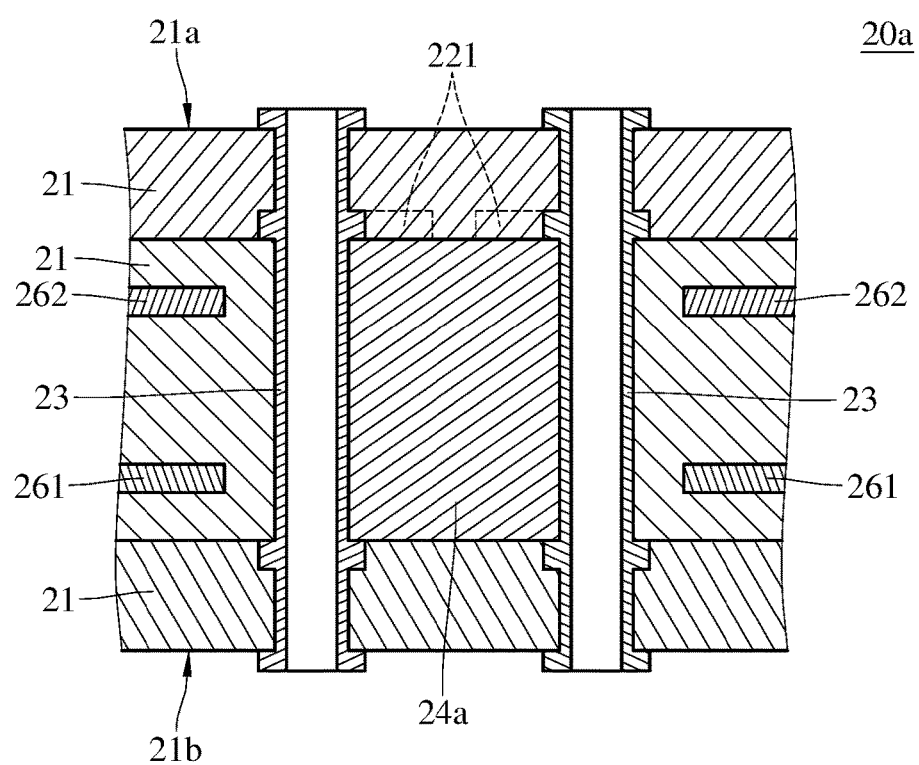
FIG. 6 is a cross-sectional view of a differential signal transmitting circuit board according to yet another embodiment of the invention.

Please refer to FIG. 6. FIG. 6 is a cross-sectional view of a differential signal transmitting circuit board according to yet another embodiment of the invention. In this embodiment, a differential signal transmitting circuit board 20a is provided. The differential signal transmitting circuit board 20a is similar to the differential signal transmitting circuit board 10 in FIG. 1 and FIG. 2 and the differential signal transmitting circuit board 20 in FIG. 5, so the differences among them are described. The differential signal transmitting circuit board 20a further includes a first electrically conductive layer 261 and a second electrically conductive layer 262. The first electrically conductive layer 261 and the second electrically conductive layer 262 are disposed in the base layer 21 and parallel to the first electrically conductive lines 221. The electrically conductive components 23 penetrate through the base layer 21, and two ends of each electrically conductive component 23 are respectively located on the first surface 21a and the second surface 21b. The insulating component 24a is embedded in the base layer 21.

Figure 7:
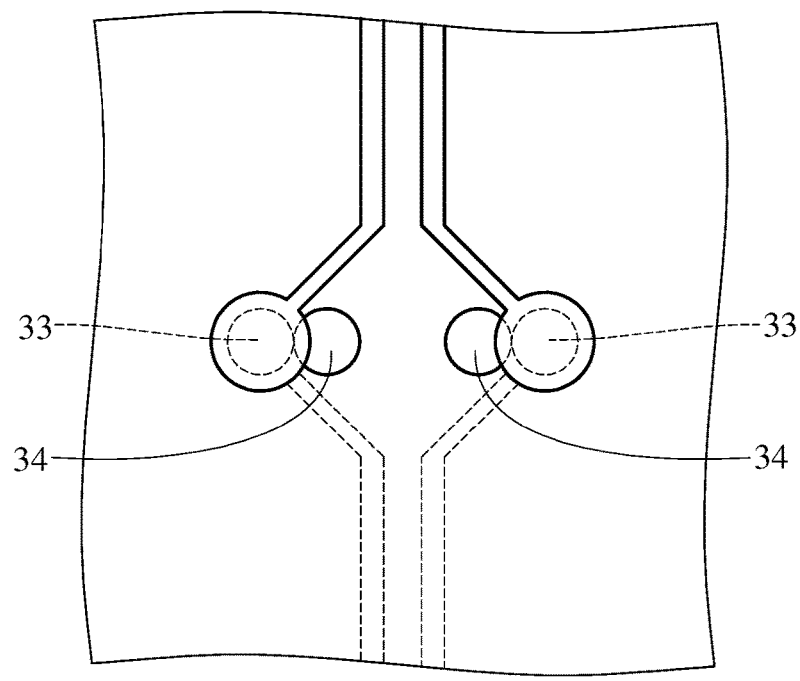
FIG. 7 is a top view of a differential signal transmitting circuit board according to still another embodiment of the invention.
Figure 8:
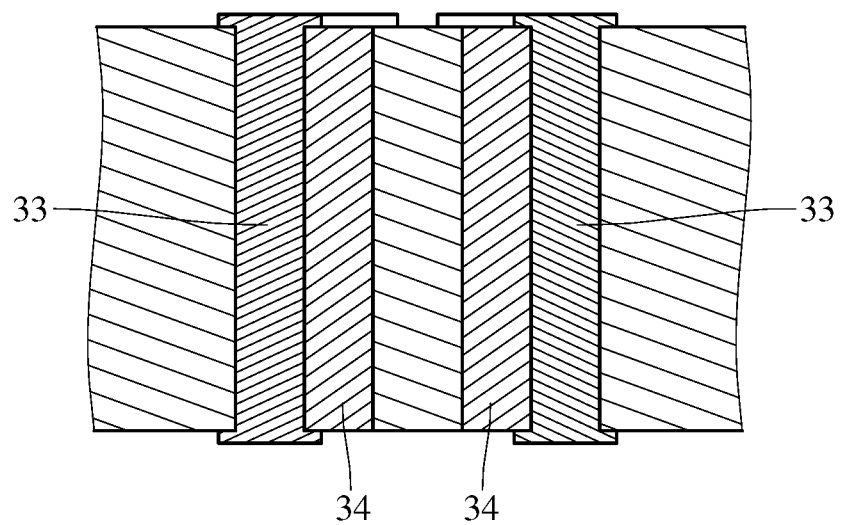
FIG. 8 is a cross-sectional view of the differential signal transmitting circuit board in FIG. 7.

Please refer to FIG. 7 and FIG. 8. FIG. 7 is a top view of a differential signal transmitting circuit board according to still another embodiment of the invention, and FIG. 8 is a cross-sectional view of the differential signal transmitting circuit board in FIG. 7. In this embodiment, a differential signal transmitting circuit board 30 is provided. The differential signal transmitting circuit board 30 is similar to the differential signal transmitting circuit board 10 in FIG. 1, so the differences between these embodiments are described. The differential signal transmitting circuit board 30 includes two insulating components 34. The two insulating components 34 are located between the two electrically conductive components 33. In other words, the insulating components 34 are respectively located at inner sides of the electrically conductive components 33. The insulating components 34 are respectively in contact with the electrically conductive components 33.

Figure 9:
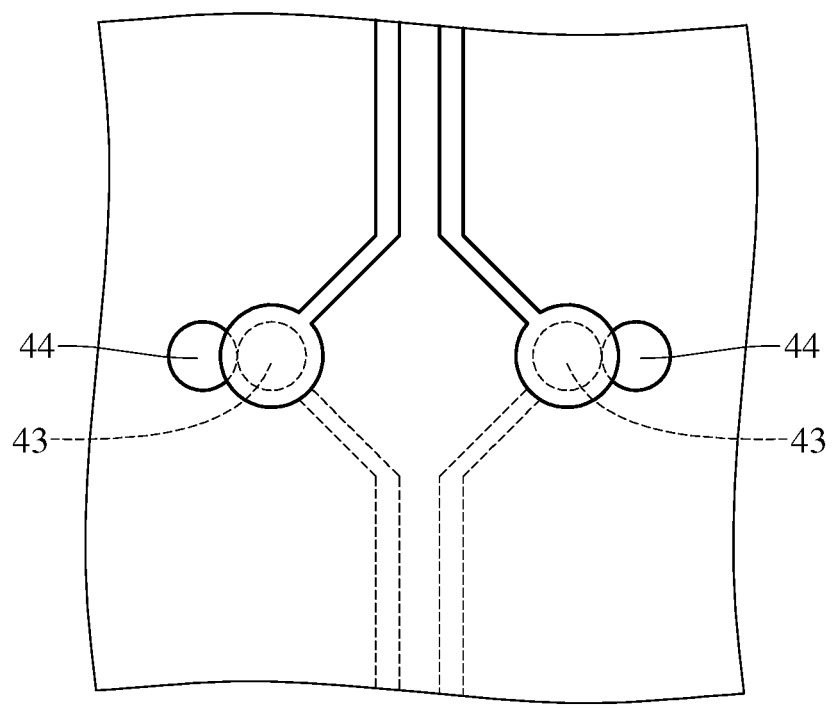
FIG. 9 is a top view of a differential signal transmitting circuit board according to still yet another embodiment of the invention.
Figure 10:
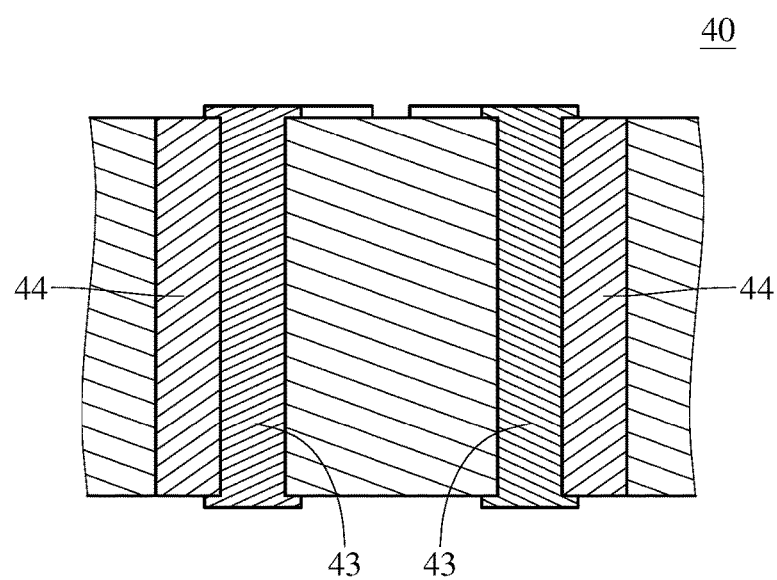
FIG. 10 is a cross-sectional view of the differential signal transmitting circuit board in FIG. 9.

Please refer to FIG. 9 and FIG. 10. FIG. 9 is a top view of a differential signal transmitting circuit board according to still yet another embodiment of the invention, and FIG. 10 is a cross-sectional view of the differential signal transmitting circuit board in FIG. 9. In this embodiment, a differential signal transmitting circuit board 40 is provided. The differential signal transmitting circuit board 40 is similar to the differential signal transmitting circuit board 10 in FIG. 1 and FIG. 2, so the differences between these embodiments are described. The differential signal transmitting circuit board 40 includes two insulating components 44. The two electrically conductive components 43 are located between the two insulating components 44. In other words, the two insulating components 44 are respectively located at outer sides of the electrically conductive components 43. The insulating components 44 are respectively in contact with the electrically conductive components 43.

Figure 11:
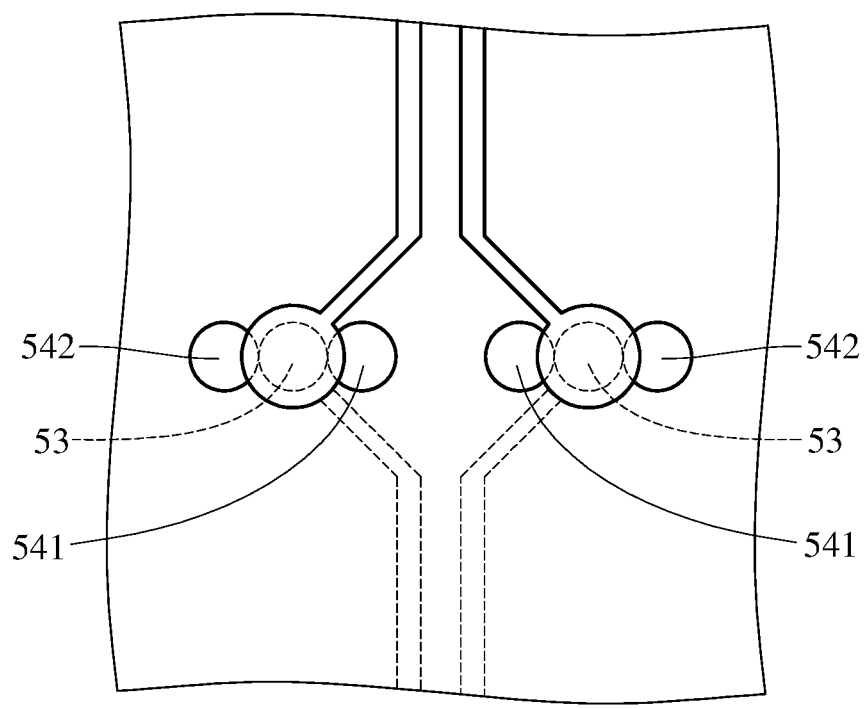
FIG. 11 is a top view of a differential signal transmitting circuit board according to yet a further embodiment of the invention.
Figure 12:
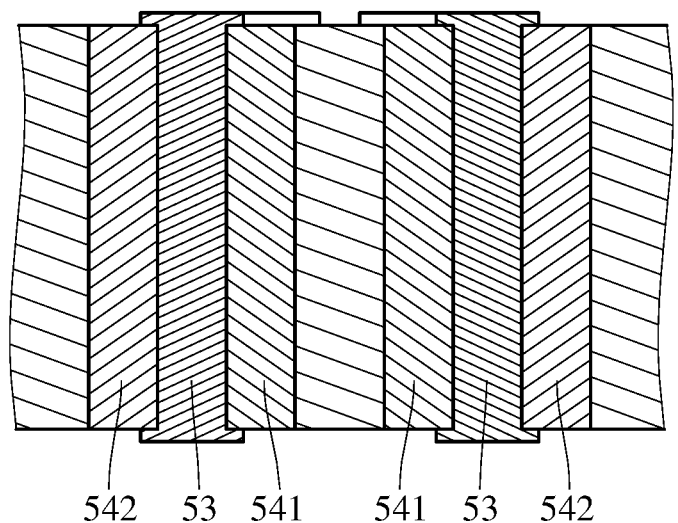
FIG. 12 is a cross-sectional view of the differential signal transmitting circuit board in FIG. 11.

Please refer to FIG. 11 and FIG. 12. FIG. 11 is a top view of a differential signal transmitting circuit board according to yet a further embodiment of the invention. FIG. 12 is a cross-sectional view of the differential signal transmitting circuit board in FIG. 11. In this embodiment, a differential signal transmitting circuit board 50 is provided. The differential signal transmitting circuit board 50 is similar to the differential signal transmitting circuit board 10 in FIG. 1 and FIG. 2, so the differences between these embodiments are described. The differential signal transmitting circuit board 50 includes two first insulating components 541 and two second insulating components 542. The two first insulating components 541 are located between the two electrically conductive components 53. The two electrically conductive components 53 are located between the two second insulating components 542. In other words, the two first insulating components 541 are respectively located at inner sides of the electrically conductive components 53, and the two second insulating components 542 are respectively located at outer sides of the electrically conductive components 53. The first insulating components 541 are respectively in contact with the electrically conductive components 53, and the second insulating components 542 are respectively in contact with the electrically conductive components 53.

Figure 13:
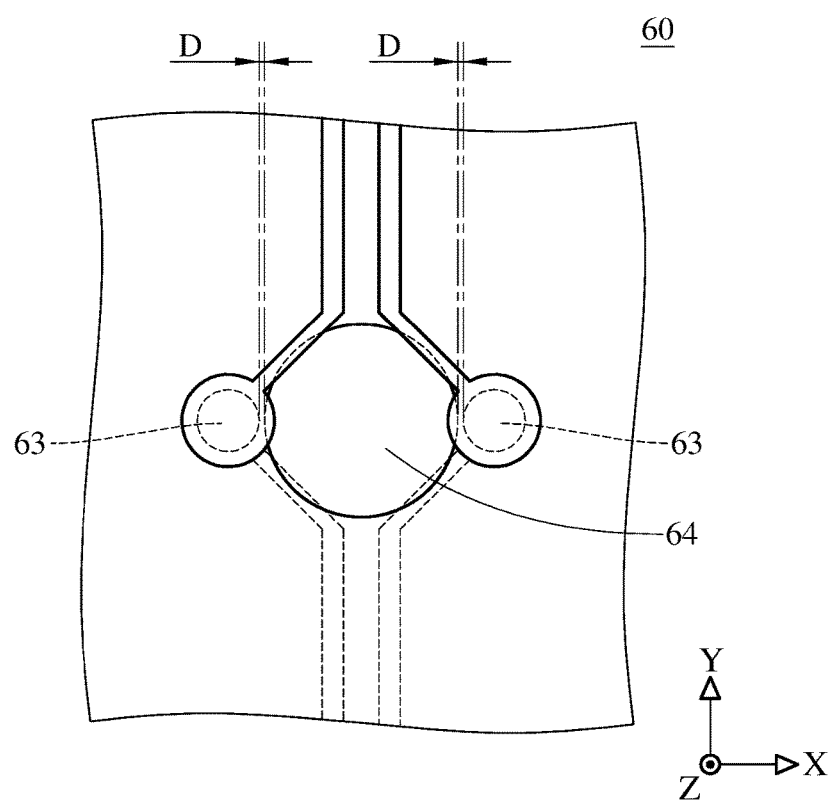
FIG. 13 is a top view of a differential signal transmitting circuit board according to still yet a further embodiment of the invention.
Figure 14:
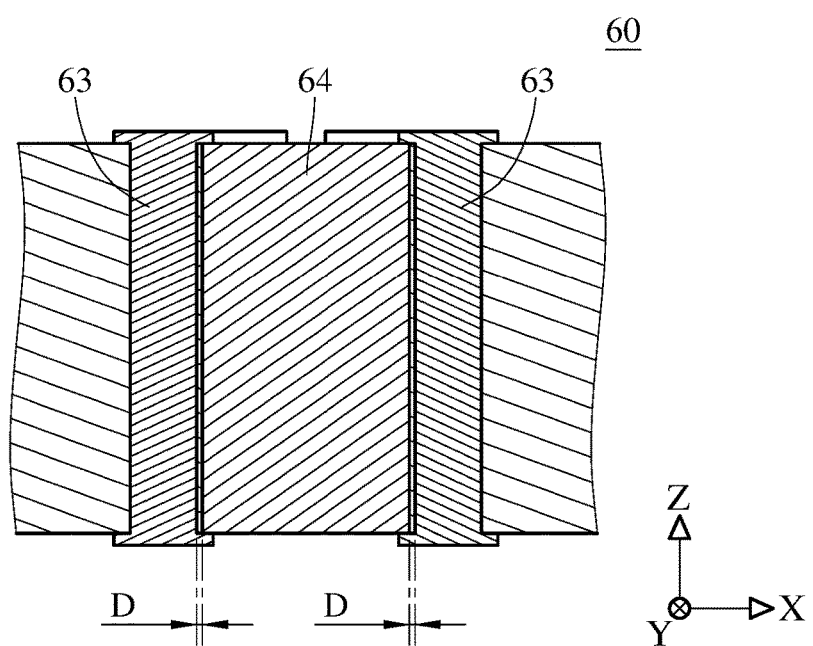
FIG. 14 is a cross-sectional view of the differential signal transmitting circuit board in FIG. 13.

Please refer to FIG. 13 and FIG. 14. FIG. 13 is a top view of a differential signal transmitting circuit board according to still yet a further embodiment of the invention, and FIG. 14 is a cross-sectional view of the differential signal transmitting circuit board in FIG. 13. In this embodiment, a differential signal transmitting circuit board 60 is provided. The differential signal transmitting circuit board 60 is similar to the differential signal transmitting circuit board 10 in FIG. 1 and FIG. 2, so the differences between these embodiments are described. In the differential signal transmitting circuit board 60, the insulating components 64 are respectively close to but not in contact with the two electrically conductive components 63. For example, a distance D between an outer surface of the insulating component 64 and an outer surface of one of the electrically conductive components 63 is greater than 0 and less than an outer diameter of each electrically conductive component 63, but the differential signal transmitting circuit board 60 is still able to achieve a similar effect as the differential signal transmitting circuit board 10 in FIG. 1 and FIG. 2.

Similarly, although the insulating component 24 of the differential signal transmitting circuit board 20 (as shown in FIG. 5) is in contact with the electrically conductive components 23, but the present invention is not limited thereto. In some embodiments, the configuration, in which the insulating component 24 is disposed close to but not in contact with the electrically conductive components 23, is able to achieve a similar effect as the differential signal transmitting circuit board 20 in FIG. 5.

As shown in FIG. 6, although the insulating component 24a is in contact with the electrically conductive components 23, but the present invention is not limited thereto. In some embodiments, the configuration, in which the insulating component 24a is disposed close to but not in contact with the electrically conductive components 23, is able to achieve a similar effect as the differential signal transmitting circuit board 20a in FIG. 6.

As shown in FIG. 7 and FIG. 8, although the insulating components 34 are respectively in contact with the electrically conductive components 33, but the present invention is not limited thereto. In some embodiments, the configuration, in which the insulating components 34 are respectively disposed close to but not in contact with the electrically conductive components 33, is able to achieve a similar effect as the differential signal transmitting circuit board 30 in FIGS. 7 and 8.

As shown in FIG. 9 and FIG. 10, while the insulating components 44 are respectively in contact with the electrically conductive components 43, but the present invention is not limited thereto. In some embodiments, the configuration, in which the insulating components 44 are respectively disposed close to but not in contact with the electrically conductive components 43, is able to achieve a similar effect as the differential signal transmitting circuit board 40 in FIGS. 9 and 10.

As shown in FIG. 11 and FIG. 12, although the first insulating components 541 are respectively in contact with the electrically conductive components 53, and the second insulating components 542 are respectively in contact with the electrically conductive components 53, but the present invention is not limited thereto. In some embodiments, the configuration, in which the first insulating components 541 are respectively disposed close to but not in contact with the electrically conductive components 53, and the second insulating components 542 are respectively disposed close to but not in contact with the electrically conductive components 53, is able to achieve a similar effect as the differential signal transmitting circuit board 50 in FIGS. 11 and 12.

Figure 15:
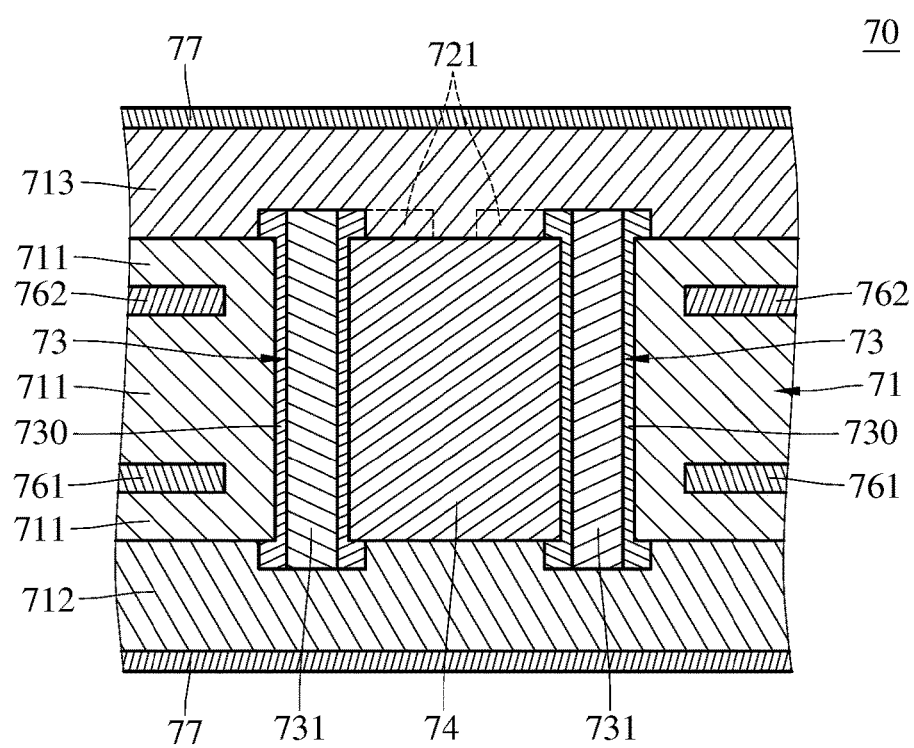
FIG. 15 is a top view of a differential signal transmitting circuit board according to still yet another embodiment of the invention.

Please refer to FIG. 15, which is a top view of a differential signal transmitting circuit board according to still yet another embodiment of the invention. In this embodiment, a differential signal transmitting circuit board 70 is provided. The differential signal transmitting circuit board 70 is similar to the differential signal transmitting circuit board 20a in FIG. 6, so the differences between these embodiments are described. The differential signal transmitting circuit board 70 further includes a first electrically conductive layer 761 and a second electrically conductive layer 762, which are disposed in the base layer 71 and parallel to the first electrically conductive line 721. The base layer 71 is a composite layer including a first layer body 711, a second layer body 712 and a third layer body 713. The electrically conductive components 73 and the insulating component 74 penetrate through the first layer body 711. The second layer body 712 and the third layer body 713 cover the electrically conductive components 73 and the insulating component 74, so that the electrically conductive components 73 and the insulating component 74 are embedded in the base layer 71. There are electrically conductive line layers 77 respectively disposed on the surface of the second layer body 712 and the surface of the third layer body 713.

In addition, in this embodiment, each electrically conductive component 73 includes a columnar, hollow, electrically conductive object 730 and a filling material 731 filling up the hollow electrically conductive object 730. The filling material 731 is made of gel, isolation material or electrically conductive material. The present invention is not limited to the electrically conductive component 73. In some embodiments, the electrically conductive component may be a columnar, solid, electrically conductive object.

Figure 16:
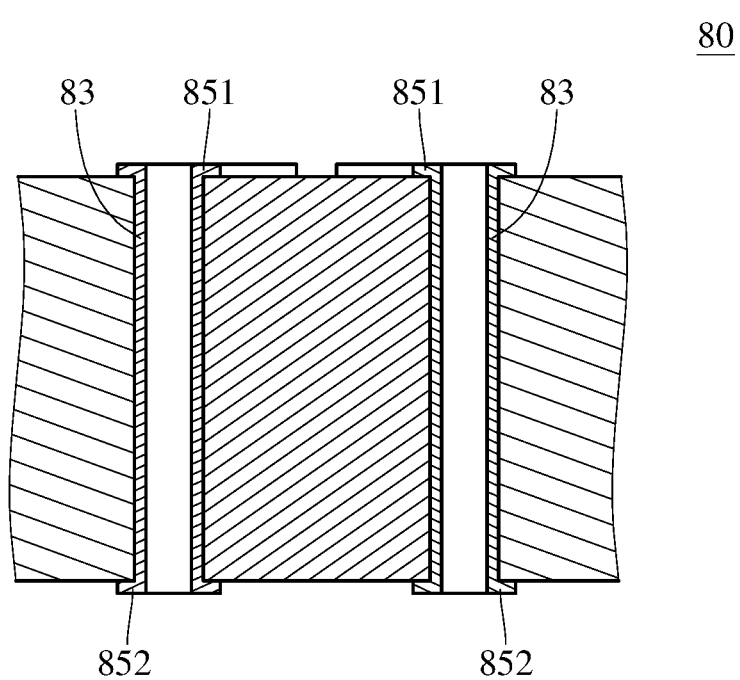
FIG. 16 is a cross-sectional view of the differential signal transmitting circuit board.

Please refer to FIG. 16, which is a cross-sectional view of the differential signal transmitting circuit board. In this embodiment, a differential signal transmitting circuit board 80 is provided. The differential signal transmitting circuit board 80 is similar to the differential signal transmitting circuit board 10 in FIG. 2, so the differences between them are described. Each electrically conductive component 83 of the differential signal transmitting circuit board 80 is a columnar, hollow and electrically conductive object. Each first electrically conductive pad 851 and each second electrically conductive pad 852 are hollow. The present invention is not limited to the shape of the electrically conductive component 83, in some embodiments; the electrically conductive component may be a columnar, solid and electrically conductive object. Or, the electrically conductive component may be a columnar, hollow and electrically conductive object filled with a filling material, such as a gal, an isolation material or an electrically conductive material.

Similarly, the present invention is not limited to the electrically conductive component 33 as shown in FIG. 8. In some embodiments, each electrically conductive component 33 of the differential signal transmitting circuit board 30 as shown in FIG. 8 may be replaced with a columnar, hollow and electrically conductive object. Or, the electrically conductive component 33 may be replaced with a columnar, hollow and electrically conductive object filled with a filling material, such as a gel, an isolation material or an electrically conductive material.

Each electrically conductive component 43 in the differential signal transmitting circuit board 40 as shown in FIG. 10 is a columnar, hollow and electrically conductive object, but the present invention is not limited thereto. In some embodiments, the electrically conductive component 43 may be replaced with a columnar, hollow and electrically conductive object filled with a filling material, such as a gel, an isolation material or an electrically conductive material.

Each electrically conductive component 53 in the differential signal transmitting circuit board 50 as shown in FIG. 12 is a columnar, hollow and electrically conductive object, but the present invention is not limited thereto. In some embodiments, the electrically conductive component 53 may be replaced with a columnar, hollow and electrically conductive object filled with a filling material, such as a gel, an isolation material or an electrically conductive material.

Each electrically conductive component 63 in the differential signal transmitting circuit board 60 as shown in FIG. 14 is a columnar, hollow and electrically conductive object, but the present invention is not limited thereto. In some embodiments, the electrically conductive component 63 may be replaced with a columnar, hollow and electrically conductive object filled with a filling material, such as a gel, an isolation material or an electrically conductive material.

According to the differential signal transmitting circuit board as discussed above, due to the configuration of the insulating component being located close to or in contact with the electrically conductive components, an equivalent impedance of the electrically conductive components is able to be properly adjusted in order to match a specific value. Therefore, the signal reflection in the electrically conductive components is reduced so as to reduce signal distortion of the differential signal, so that the circuit board is able to transmission high-frequency differential signal.

It will be apparent to those skilled in the art that various modifications and variations can be made to the present invention. It is intended that the specification and examples be considered as exemplary embodiments only, with a scope of the invention being indicated by the following claims and their equivalents.

NUMERALS 10, 20, 20a, 30, 40, 50, 60, 70, 80 differential signal transmitting circuit board
11, 21, 71 base layer
11a, 21a first surface
11b, 21b second surface
121, 221, 721 first electrically conductive line
122 second electrically conductive line
13, 23, 33, 43, 53, 63, 73, 83 electrically conductive component
14, 24, 24a, 34, 44, 64, 74 insulating component
151, 851 first electrically conductive pad
152, 852 second electrically conductive pad
211 hole
240 volatile material
261, 761 first electrically conductive layer
262, 762 second electrically conductive layer
541 first insulating component
542 second insulating component
711 first layer body
712 second layer body
713 third layer body
730 hollow and electrically conductive object
731 filling material
77 electrically conductive line layer
D distance
R1, R2, R3 range

The invention claimed is:

1. A differential signal transmission circuit board, comprising:
   a base layer;
   at least two electrically conductive components, being disposed in the base layer; wherein each of the at least two electrically conductive components comprises a hollow electrically conductive object and a filling material filled in the hollow electrically conductive object; and
   at least one insulating component, being disposed in the base layer, and the at least one insulating component being located close to or in contact with the at least two electrically conductive components; wherein the at least one insulating component is located between the hollow electrically conductive objects of the at least two electrically conductive components and spaced apart from the filling materials in the hollow electrically conductive objects, and the at least two electrically conductive components are not surrounded by the at least one insulating component.

2. A differential signal transmission circuit board, comprising:
   a base layer;
   at least two electrically conductive components, being disposed in the base layer; wherein each of the at least two electrically conductive components comprises a hollow electrically conductive object and a filling material filled in the hollow electrically conductive object; and
   at least one insulating component, being disposed in the base layer, and the at least one insulating component being located close to or in contact with the at least two electrically conductive components; wherein the at least one insulating component is located between the hollow electrically conductive objects of the at least two electrically conductive components and spaced apart from the filling materials in the hollow electrically conductive objects, and the at least two electrically conductive components are not surrounded by the at least one insulting component;
   wherein, the base layer has a first equivalent dielectric constant, the at least one insulating component has a second equivalent dielectric constant, and the first equivalent dielectric constant is different from the second equivalent dielectric constant.

3. The differential signal transmission circuit board according to claim 2, wherein the at least two electrically conductive components are configured for differential signal transmission.

4. The differential signal transmission circuit board according to claim 2, wherein the base layer has a first surface and a second surface opposite to each other, and the at least two electrically conductive components penetrate through the base layer, and two ends of each of the at least two electrically conductive components are respectively located on the first surface and the second surface.

5. The differential signal transmission circuit board according to claim 2, further comprising at least two electrically conductive lines, and the at least two electrically conductive lines respectively electrically connected to the at least two electrically conductive components.

6. The differential signal transmission circuit board according to claim 5, wherein the at least two electrically conductive lines extend along a horizontal direction of the base layer, and the at least two electrically conductive components extend along a vertical direction of the base layer.

7. The differential signal transmission circuit board according to claim 2, wherein the quantity of the at least one insulating component is one, and the insulating component is located between the at least two electrically conductive components.

8. The differential signal transmission circuit board according to claim 2, wherein the quantity of the at least one insulating components is two, and the two insulating components are located between the at least two electrically conductive components.

9. The differential signal transmission circuit board according to claim 2, wherein the at least one insulating component comprises two first insulating components and two second insulating components, the two first insulating components are located between the at least two electrically conductive components, and the at least two electrically conductive components are located between the two second insulating components.

10. The differential signal transmission circuit board according to claim 2, wherein the at least one insulating component is located close to the at least two electrically conductive components, and a distance between an outer surface of the at least one insulating component and an outer surface of each of the at least two electrically conductive components is greater than zero and less than an outer diameter of each of the at least two electrically conductive components.

11. The differential signal transmission circuit board according to claim 2, further comprising a first electrically conductive layer being disposed in the base layer, the at least two electrically conductive components and the first electrically conductive layer being electrically isolated from each other through the base layer.

12. The differential signal transmission circuit board according to claim 2, further comprising a second electrically conductive layer being disposed in the base layer, the at least two electrically conductive components and the second electrically conductive layer being electrically isolated from each other through the base layer.

13. The differential signal transmission circuit board according to claim 2, wherein the base layer has at least one hole, the at least one hole extends from a surface of the base layer to the at least one insulating component.

14. The differential signal transmission circuit board according to claim 2, wherein the second equivalent dielectric constant ranges in 1 to 50.

15. The differential signal transmission circuit board according to claim 2, wherein the base layer is a composite layer.

16. The differential signal transmission circuit board according to claim 2, wherein the filling material is made of gel, isolation material or electrically conductive material.

17. The differential signal transmission circuit board according to claim 2, wherein the quantity of the at least one insulating components is two, and the two insulating components are respectively located at inner sides of the at least two electrically conductive components.

* * * * *